(12) United States Patent
Ryckman et al.

(10) Patent No.: US 10,483,934 B2
(45) Date of Patent: Nov. 19, 2019

(54) AUDIO LEVELING AND ENHANCEMENT DEVICE

(71) Applicants: Lawrence G. Ryckman, Scottsdale, AZ (US); Sheldon G. Yakus, Minden, NV (US); Ari Blitz, Encino, CA (US)

(72) Inventors: Lawrence G. Ryckman, Scottsdale, AZ (US); Sheldon G. Yakus, Minden, NV (US); Ari Blitz, Encino, CA (US)

( * ) Notice: Subject to any disclaimer, the term of this patent is extended or adjusted under 35 U.S.C. 154(b) by 0 days.

(21) Appl. No.: 15/763,342

(22) PCT Filed: Sep. 26, 2016

(86) PCT No.: PCT/US2016/053734
§ 371 (c)(1),
(2) Date: Mar. 26, 2018

(87) PCT Pub. No.: WO2017/053950
PCT Pub. Date: Mar. 30, 2017

(65) Prior Publication Data
US 2018/0278225 A1    Sep. 27, 2018

Related U.S. Application Data

(60) Provisional application No. 62/232,952, filed on Sep. 25, 2015.

(51) Int. Cl.
| | | |
|---|---|---|
| H03G 5/16 | (2006.01) | |
| H03G 7/00 | (2006.01) | |
| H03G 3/30 | (2006.01) | |
| G10L 21/0324 | (2013.01) | |

(52) U.S. Cl.
CPC .......... *H03G 5/165* (2013.01); *H03G 3/3005* (2013.01); *H03G 7/002* (2013.01); *G10L 21/0324* (2013.01)

(58) Field of Classification Search
CPC ....... H03G 5/165; H03G 3/3005; H03G 7/002
See application file for complete search history.

(56) References Cited

U.S. PATENT DOCUMENTS

2014/0328503 A1* 11/2014 Shirai .................. G10H 1/0091
                                                             381/119
2014/0334627 A1* 11/2014 Kulavik .................... H03G 3/20
                                                              381/57
2016/0191007 A1*  6/2016 Li ......................... H03G 9/005
                                                             381/107

* cited by examiner

*Primary Examiner* — Andrew L Sniezek
(74) *Attorney, Agent, or Firm* — The Weintraub Group, P.L.C.

(57) ABSTRACT

A device for audio leveling and sound enhancement to overcome the lower sounding level than an audio video transmission. The device is interposed at source, such an HDMI cable and a device that can reproduce the enhanced sound such as a television, computer monitor and the like. If the device includes an audio leveler and a pc board or chip having the requisite circuitry and/or software for enhancing the sound and which is in electrical communication with the audio leveler. The housing includes an input port for receiving the initial audio signal and an output port which connects to a audio reproducing device after the inputted signal has been processed.

8 Claims, 2 Drawing Sheets

Signal flow read from top to bottom

Key:
Lim - Limiter
Exp - Expander
Comp - Compressor
EQ - Equalizer
Vol - Volume

AUDIO LEVELING AND ENHANCEMENT DEVICE

CROSS-REFERENCE TO RELATED APPLICATION

This application is a national application based on PCT Application Serial No. PCT/US2016/053734, filed Sep. 26, 2016, which is a completion application of U.S. Provisional Patent Application Ser. No. 62/232,952, filed Sep. 26, 2015 for "AUDIO LEVELING AND ENHANCEMENT DEVICE", the entire disclosure of which is hereby incorporated by reference, including the drawing.

BACKGROUND OF THE INVENTION

1. Field of Invention

The present invention pertains to audio leveling and enhancement devices. More particularly, the present invention pertains to audio leveling devices for use in conjunction with audio-visual appliances or devices. Even more particularly, the present invention pertains to leveling devices for use with televisions, DVD players, and the like.

2. Prior Art

As is known to those skilled in the art, the sound or audio ordinarily occasioned with radios, televisions, DVD players and the like which broadcasts sound through the radio or television through the sound system experience the situation where the dialogue sounds as if it is at a lower sound level than the balance of the sound being transmitted. This results in the user constantly having to adjust the sound level through the remote control device. This is not only aggravating but greatly diminishes the enjoyment of listening to or watching the show or transmission.

The same disconnect is experienced when playing a disc on a computer, on a monitor, or other digital-audio device.

The prior art has sought to alleviate this situation through various circuitry such as disclosed in U.S. Pat. Nos. 5,839,834; 7,203,325; 6,169,807 and 5,130,665 the disclosures of which are hereby incorporated by reference.

Thus, there exists a need for a device which overcomes these deficiencies as well as enhancing the sound when it is transmitted. The present invention is directed to this.

SUMMARY OF THE INVENTION

The present invention is an audio leveling device which, generally, comprises a housing having both an audio leveler in electrical communication with a means for sound enhancing. The device hereof is interposed between a source of an audio video signal and a device that reproduces the audio video signal received from the device.

The device, itself, comprises an audio leveler in electrical communication with the means for enhancing the sound. The means for enhancing the sound comprises any suitable electronic device such as a microchip, pc board or the like which incorporates means for layering the signal received from the audio leveler.

For a more complete understanding of the present invention reference is made to the following detailed description and accompany drawing.

In the drawing like reference characters refer to like parts throughout several views in which:

Figure 1:
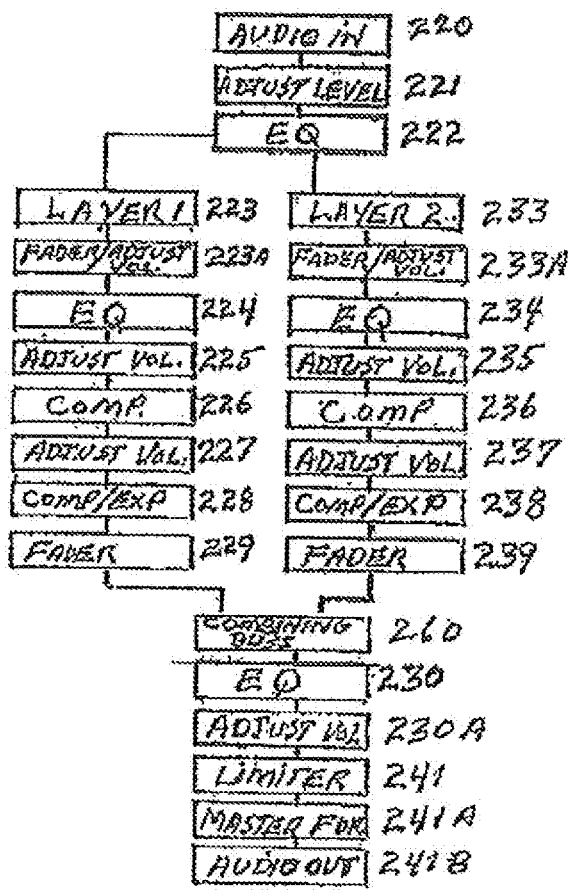
FIG. 1 is a flow chart illustrating the manner in which the sound is enhanced.

At the outset, it is to be noted that the present invention is directed to a device that transmits enhanced audio-visual and/or visual signals received from a source that can reproduce the enhanced audio video signal, such as a television, computer monitor, cables, wireless, RCA cable and HDMI (high-definition multi-media interface) transmissions. For purposes of describing the present invention, the ensuing description will be made with reference to an HDMI environment. However, it is to be understood that the present invention is not so-limited but includes the other transmissions enumerated above.

DESCRIPTION OF THE INVENTION

As is known to those skilled in the art to which the present invention pertains, an HDMI device is a compact audio-video interface for transferring uncompressed video data and uncompressed digital audio data from an HDMI compliance source device to a compatible computer or TV monitor, video device, or digital audio device. It is a digital replacement for existing analog video standards.

Referring now to the drawing, there depicted therein, a device, generally denoted at 10, which levels and enhances the audio signals associated with an HDMI device. The present device, is interposed an HDMI source (not shown) and an audio/visual device (not shown) in order to level and enhance the sound.

The device hereof comprises a housing 11 having an input port 12 and an output port 14. An HDMI cable leads from the source into the input port 12.

Disposed within the device 10 is an audio leveling device or audio leveler, generally, denoted at 16. The device 16 has a first or input side 17 and a second or output side 17'. The device is electrically connected to the input port 12. This can be achieved in a multitude of ways. For example, the device 16 may be hard wired to the port 12. The port 12 may be integrally formed with and as part of the device 16 or the like. Thus, the device 16 is in contact with the output of the HDMI cable at the input 12 at its first end 17 and is in electrical communication with means for sound enhancing 18 at its second end 17'.

The means for sound enhancing 18 has an input 20 connected to the output 17' of device 16 and an output 20 connected to port 14. The output 17' of the audio leveling device or audio leveler 16 is in electrical communication with the input 20 of the sound enhancing means.

With more particularity, the present device, initially, brings up the dialog for tracking while bringing the sound up to peak via the audio leveling device 16 which is a signal processing device.

Audio leveling devices such as those disclosed in the prior art are well known and commercially available such as those available from Gefen, LLC, which provides audio leveling devices which operate at the nominal level.

The nominal level is the operating level at which an electronic signal processing device is designed to operate. The electronic circuits that make up such equipment are limited in the maximum signal they can output and the low-level internally generated electronic noise they add to the signal. The difference between the internal noise and the maximum output level is the device's dynamic range. When a signal is chained improperly through many devices, the dynamic range of the signal is reduced. The nominal level is the level that these devices were designed to operate at, for best dynamic range.

A related measurement related to nominal level is signal-to-noise ratio. Signal-to-noise ratio is usually defined as the difference between the nominal level and the noise floor, leaving the "headroom" as the difference between nominal and maximum output. The measured level is a time average, meaning that the peaks of audio signals regularly exceed the measured average level. The headroom measurement defines how far the peak levels can stray from the nominal measured level before clipping. The difference between the peaks and the average for a given signal is the crest factor.

Gain is applied to make the average signal level correspond to the designed or nominal level.

Generally, these audio leveling devices comprise dynamic range compression, also called DRC or simply compression. Compression reduces the volume of loud sounds or amplifies quiet sounds by narrowing or "compressing" an audio signal's dynamic range. Compression is commonly used in sound recording and reproduction and broadcasting and on instrument amplifiers.

In other words, a compressor reduces the level of an audio signal if its amplitude exceeds a certain threshold. It is commonly set in dB, where a lower threshold (e.g. −60 dB) means a larger portion of the signal will be treated (compared to a higher threshold of −5 dB).

Downward compression reduces loud sounds over a certain threshold while quiet sounds remain unaffected. Upward compression increases the loudness of sounds below a threshold while leaving louder passages unchanged. Both downward and upward compression reduce the dynamic range of an audio signal.

An expander performs the opposite function, increasing the dynamic range of an audio signal. Expanders are generally used to make quiet sounds even quieter by reducing the level of an audio signal that falls below a set threshold level. A noise gate is a type of expander.

The signal entering a compressor is split, one copy sent to a variable-gain amplifier and the other to a side-chain where a circuit controlled by the signal level applies the required gain to an amplifier stage. This design, known as a "feedforward" type, is used today in most compressors.

There are a number of technologies used for variable gain amplification, each having different advantages and disadvantages. For example, even in today's technology, vacuum tubes are used in a configuration called 'variable-mu': the grid-to-cathode voltage changes to alter the gain. A voltage controlled amplifier (VCA) is also used and which has its gain reduced as the power of the input signal increases. Optical compressors use a light sensitive resistor (LDR) and a small lamp (LED or electroluminescent panel) to create changes in signal gain. Optical compressors add smoother characteristics to the signal because the response times of the light and the resistor soften the attack and release. Other technologies used in audio levelers include field effect transistors and a diode bridge.

With digital audio as is occasioned herein, digital signal processing techniques are commonly used to implement compression via digital audio editors or dedicated workstations. Often the algorithms used emulate analog technologies. The amount of gain reduction is determined by a ratio. For example, a ratio of 4:1 means that if the input level is 4 dB over the threshold, the output signal level will be 1 dB over the threshold. Therefore, the gain (level) has been reduced by 3 dB:

Threshold=−10 dB
Input=−6 dB (4 dB above the threshold)
Output=−9 dB (1 dB above the threshold)

The highest ratio of ∞:1 is often known as 'limiting'. It is commonly achieved using a ratio of 60:1, and effectively denotes that any signal above the threshold will be brought down to the threshold level (except briefly after a sudden increase in input loudness, known as an "attack").

A compressor might provide a degree of control over how quickly it acts. The 'attack phase' is the period when the compressor is decreasing gain to reach the level that is determined by the ratio. The 'release phase' is the period when the compressor is increasing gain to the level determined by the ratio, or, to zero dB, once the level has fallen below the threshold.

The length of each period is determined by the rate of change and the required change in gain. For more intuitive operation, a compressor's attack and release controls are labeled as a unit of time (often milliseconds). This is the amount of time it will take for the gain to change a set amount of dB, decided by the manufacturer, very often 10 dB. For example, if the compressor's time constants are referenced to 10 dB, and the attack time is set to 1 ms, it will take 1 ms for the gain to decrease by 10 dB, and 2 ms to decrease by 20 dB.

In many compressors the attack and release times are adjustable by the user. Some compressors, however, have the attack and release times determined by the circuit design and these cannot be adjusted by the user. Sometimes the attack and release times are 'automatic' or 'program dependent', meaning that the times change depending on the input signal. Because the loudness pattern of the source material is modified by the compressor it may change the character of the signal in subtle to quite noticeable ways depending on the settings used.

Regardless of how the sound leveling is achieved, the output from the leveling device is then fed into the means for enhancing the sound.

As shown in FIG. 1, an audio signal from the leveling device 16 is processed beginning at 221.

At the outset, it should be noted that the ensuing description of sound enhancement is contemplated as being incorporated into a microchip having DAW software imbedded therein. Alternatively, a PC board which is disposed within the housing having the requisite circuitry which simulates the compressor, fader, expander, limiter, etc., functions and can be utilized to create the sound enhancement function.

According to the present invention, generally, enhancement is achieved by taking the output of the leveling device and creating a signal of that initial signal and at least one secondary signal which is also a duplicate of the initial signal and creating at least two layers therefrom. Optimally, each of the layers is processed by an equalizer which is at a selected frequency. The frequencies of each layer can be the same or different from each other.

Preferably, at least one of the layers is processed by passing it through a preselected electronic equipment, e.g. plug-ins and/or outboard gear. As described in U.S. Pat. No. 9,390,698, the disclosure of which is hereby incorporated by reference the volumes are initially adjusted. Then, after at least one layer is processed, the signals are layered and passed through an equalizer, then have their volumes adjusted, then passed through a leveler and, then, a master fader from which the layered signals are outputted.

As shown in FIG. 1, inputted signal 220 from the leveler is processed at 221. Typically, the level is adjusted to about 8 to 16 dB. A standard volume control is utilized. Alternatively, the signal volume may be raised, lowered or adjusted at any point in the enhancement process.

Initially, an equalizer 222 either filters out any unwanted frequencies or boosts or adds frequencies in the duplicate signal. The output from the equalizer is split into at least one exact copy of the initial signal and one secondary signal which is an exact duplicate of the signal of the initial. The signals are then processed and layered. In FIG. 1, this is shown as Layer 1 at 223 and Layer 2 at 233. Frequencies in the range of 125 to 400 cycles per second can be adjusted to any desired levels or volume, any subsequent layers will be affected by this reduction. The use of the equalizer can, if desired, be eliminated, but has found to be important in facilitating processing of the signal during subsequent processing of each of the layers 223, 233.

Although not shown in the drawing, if desired, more than two layers can be produced such as Layer 3, Layer 4, etc. which can be processed according to the manner shown in FIG. 1.

As shown in FIG. 1, the copied or duplicated audio signal 220 is processed at 221. Once the original signal is inputted into the device, it is processed by the chip, beginning at step 221. Typically, the level is adjusted to about 8 to 16 dB. A standard volume control is utilized. Alternatively, the signal volume may be raised or adjusted at any point in the enhancement process, i.e. when premastering, mastering or remastering.

The equalizer 222 either filters out any unwanted frequencies or boosts or adds frequencies in the duplicate. The output from the equalizer is split into the at least one exact copy of the initial signal or file and the secondary signal which is an exact duplicate of the signal of the initial identified as Layers 1 and 2, respectively. In FIG. 1, this is shown as Layer 1 at 223 and Layer 2 at 233. Frequencies in the range of 125 to 400 cycles per second can be adjusted to any desired levels or volume. Any subsequent layers will be affected by this reduction. The use of the equalizer can, if desired, be eliminated, but has been found important in facilitating processing of the signal during subsequent processing in each of the layers 223, 233.

Although not shown in the drawing, if desired, more than two layers can be produced such as Layer 3, Layer 4, etc. which can be processed according to the manner shown in FIG. 1.

During the processing of Layer 1 denoted at 223, Layer 1 is first adjusted in volume by fader 223$a$ and is, then, processed by equalizer 224; adjusted in volume at 225 via an equalizer volume control; compressed by compressor 226; adjusted in volume by a compressor volume control, again, at 227; processed by compressor/expander 228; has its volume once again adjusted by the fader at 229; processed by equalizer 230; adjusted in volume, again, by an equalizer volume control at 230$a$; and, then, processed by limiter 241 and sent to the output through master fader 241$a$ and output 241$b$.

Although not shown, it is to be understood that in lieu of the equalizer 224, a fader may be substituted therefor and the volume adjusted accordingly.

Layer 2 denoted at 233 is processed in the same manner as Layer 1 processing and, therefore, Layer 2 is first adjusted in volume by fader 233$a$; processed by equalizer 234; then adjusted in volume by the equalizer volume control at 235; processed by compressor 236; adjusted in volume again by the compressor volume control at 237; processed by compressor/expander 238; adjusted in volume again at the fader 239; merged atop or layered atop Layer 1 at a combining bus layered signals 260 prior to entry into the equalizer 230 where the merged layers are processed by equalizer 230; undergoes final adjustment in volume 230$a$ by the equalizer volume control; processed by limiter 241 and outputted through master fader 241$a$ and outputted at 241$b$.

More particularly, just prior to entry into the equalizer 230 the combining bus 260 is used to layer the incoming signals which then layered signals are processed together. The output is thus the layered enhanced audio.

Synchronization of the processing of all layers is important. The time required for each layer to pass through its respective processing is substantially equivalent so that each layer's signal takes substantially the same amount of time to pass through its processing and merge at the combining bus 260 and be outputted as at 241$b$. Optimally processing is done at the same time.

The signals produced by each layer 223, 233 can be equal in loudness, but in most cases, usually Layer 1 223 is louder than Layer 2 at 233. For example, Layer 1 can have its bass minimized while emphasizing and processing higher frequencies. Layer 2 can have its higher frequencies minimized while emphasizing bass frequencies or vice versa.

Similarly, If the bass frequencies in the initial audio signal are weak, Layer 2 processing can increase the loudness of the bass frequencies so that when the processed signals are joined at the combining bus 260 and prior to entry into the equalizer 230, volume adjusted 230$a$, and passed through the limiter 241, master fader 241$a$ and output 241$b$, the resulting audio signal, ordinarily or usually, increases a bass component with a greater volume and presence than is the case in the initial audio signal or vice versa.

Layer 1 and Layer 2, each, ordinarily, focuses on a band of frequencies that is different from any band of frequencies focused in the other layer. The frequencies that are not being focused on in one layer are being focused on in another layer and complement each other.

After enhancement, the dynamic range appears to be retained. When a compressor such as at 226, 236, is utilized, the threshold setting is typically adjusted to the user's desires. Preferably, each layer is processed with the equivalent at least one piece of enhancement equipment. While the processing shown in FIG. 1 is preferred, in practicing the present invention, it is essential that the signal pass through two pieces of equipment, e.g., compressor/expander and fader, etc. As used herein, the term "multiple pieces of equipment" is intended to include the equivalent of a single piece of electronic equipment which provides one or more multiple functions, e.g. compressing, volume reduction, enhances, equalizing, etc.

After enhancement, the dynamic range appears to be retained.

When a compressor such as at 226, 236, is utilized, the threshold setting is typically adjusted to the user's desires. However, the layers can be in the same band.

Figure 2:
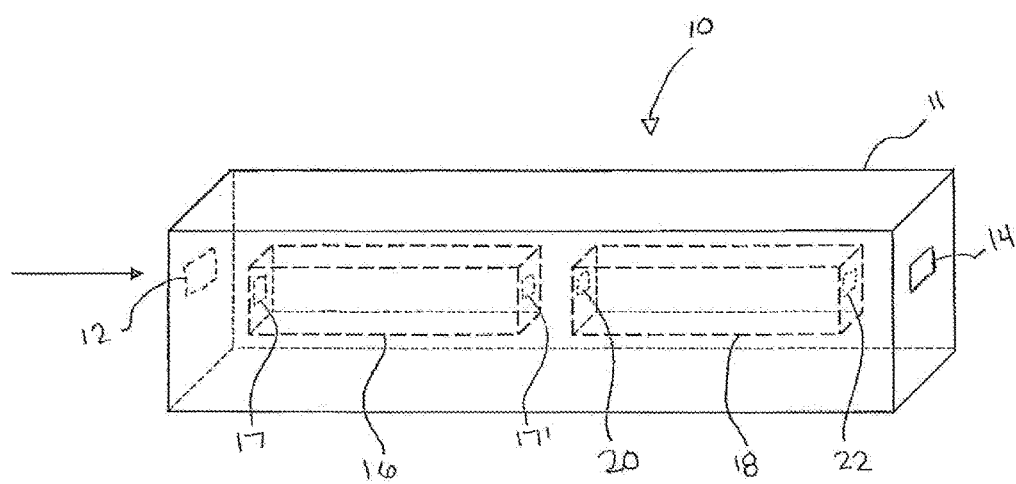
FIG. 2 is a front view showing the device of the present invention.

Preferably, each layer is processed with at least an equivalent of one piece of enhancement equipment. While the processing shown in FIG. 2 is preferred, in practicing the present invention, it is essential that the signal pass through an equivalent of two pieces of equipment, e.g., compressor/expander and fader, etc. The term "multiple pieces of equipment" is intended to include software or hard wired circuitry which simulates a single piece of electronic equipment which provides one or more multiple functions, e.g. compressing, volume reduction, enhances, equalizing, etc.

In general, the particular frequencies that Layer 1 or Layer 2 emphasizes will experience an increase in volume compared to their volume levels when the frequencies first enter the onset of the layering process from the equalizer 222.

After the sound enhancement processing is completed, it is transmitted through the output port 14 from the sound enhancement device into a receiving device having a suitable port, such as, in a television, computer monitor or similar high definition device.

It should be noted that although the present invention has been described as two separate devices, it is within the scope hereof that the present invention comprise a single device comprising the leveler and the sound enhancement device which, itself, can be a microchip, PC board or software embedded into the leveler.

The invention claimed is:

1. A device for audio leveling and sound enhancement, which comprises:
   (a) a housing having an input port for receiving an original inputted digital audio or audio-visual signal from a source and an output port for transmitting the signal from the device to a receiving device;
   (b) an audio leveler disposed within the housing and including;
      (1) an input port in electrical communication with the housing input port;
      (2) means for leveling the original input signal from the source;
      (3) an output port for outputting the leveled original input signal;
   (c) means for enhancing the original input signal received from the source the means for enhancing including;
      (1) an input port for receiving the outputted leveled original input signal from the audio leveler; and
      (2) an output port in electrical communication with the output port of the housing; and
      (3) means for layering the inputted original signal received from the audio leveler, with at least one exact duplicate of the original input signal.

2. The device of claim 1 wherein the housing input port is in electrical communication with an HDMI cable.

3. The device of claim 1 wherein the audio leveler includes means for tracking dialog signals from the source while bringing the source to peak.

4. The device of claim 1 wherein the means for enhancing the original input signal comprises a microchip disposed in the housing.

5. The device of claim 4 wherein the means for enhancing the original input signal further comprises:
   (4) means for inputting the original input signal into a signal divider and for outputting the original input signal and the at least one exact duplicate of the original input signal;
   (5) a first equalizer in communication with the means for inputting and outputting, the first equalizer simultaneously and at the same time lowering the volume of the original input signal and the at least one exact duplicate;
   (6) means for processing said original audio signal and the at least one exact duplicate outputted from the first equalizer simultaneously and at exactly the same time, the means for processing having an associated audio signal associated therewith the means for processing, comprising:
      a first limiter in communication with the first equalizer;
      means for lowering the volume of an output from the limiter;
      a compressor receiving an output from the means for lowering the volume and having an output;
      means for lowering the volume of the output from the compressor, the compressor having an output;
      an expander which receives an output from the means for lowering, the expander having an output;
      means for lowering the volume of the output from the expander;
      a second equalizer for processing the output from the expander; and
   (7) a second limiter, the output from each of the equalizers being merged at the second limiter to provide a single layered audio output therefrom.

6. The device of claim 1 wherein the means for enhancing the original input signal comprises a pc board disposed in the housing.

7. The device of claim 6 wherein the means for enhancing the original input signal comprises:
   (a) means for inputting the original input signal into a signal divider and for outputting the original input signal and the at least one exact duplicate of the original input signal;
   (b) a first equalizer in communication with the means for inputting and outputting, the equalizer simultaneously and at the same time lowering the volume of the original input signal and the at least one exact duplicate which is then provided to an output of the first equalizer;
   (c) means for processing said original input signal and the at least one exact duplicate outputted from the first equalizer simultaneously and at exactly the same time, the means for processing having an associated audio signal associated therewith, the means for processing, comprising:
      (1) a first limiter in communication with the first equalizer;
      (2) means for lowering the volume of an output from the first limiter which is then provided to an output;
      (3) a compressor receiving the output from the means for lowering the volume and having an output;
      (4) means for lowering the volume of the output from the compressor, which is provided to an output of the means for lowering;
      (5) an expander which receives the output from the means for lowering the expander having an output;
      (6) means for lowering the volume of the output from the expander;
      (7) a second equalizer for processing the output from the expander which is then provided to an output of the second equalizer; and
   (d) a second limiter, the output from each of the second equalizer being merged at the second limiter to provide a single layered audio output therefrom.

8. A method for leveling and enhancing an audio portion of an audio-visual signal, comprising:
   (a) reducing the volume of the audio portion;
   (b) duplicating the audio portion to provide at least one exact copy of the audio portion, the audio portion defining a first signal layer, the exact copy defining a secondary signal layer including at least one equivalent secondary signal of the audio portion;
   (c) separating the audio portion and the equivalent secondary signal, each as a whole, into two separate identical signal layers;
   (d) reducing the amplitude in each of the signal layers;
   (e) synchronously processing the identical signal layers by;
      (i) sequentially processing each of the signal layers with at least two pieces of equipment selected from the group consisting of a limiter, an expander, a compressor, and an equalizer, one of the signal layers being processed within a first range of frequencies and the other signal layer within a different range of frequencies; and (ii) reducing the volume of each of the signal layers as a whole when each signal layer is transmitted from one of the above pieces of equipment to another of the above pieces of equipment;

(f) merging the processed signal layers at an equalizer;

(g) processing together simultaneously the merged signal layers through at least a limiter and a master fader and then outputted, and wherein the time for processing each of the signal layers is the same.

* * * * *